United States Patent
Yoneda et al.

[11] Patent Number: 5,929,500
[45] Date of Patent: Jul. 27, 1999

[54] LIGHT RECEIVING DEVICE FOR USE IN OPTICAL FIBER COMMUNICATIONS AND THE LIKE

[75] Inventors: Isao Yoneda; Kiyoshi Fukushima; Junichi Sasaki; Hiroshi Honmou; Masataka Itoh, all of Tokyo, Japan

[73] Assignee: NEC Corporation, Tokyo, Japan

[21] Appl. No.: 08/802,560

[22] Filed: Feb. 19, 1997

[30] Foreign Application Priority Data

Feb. 27, 1996 [JP] Japan ................................. 8-039575

[51] Int. Cl.$^6$ ................................................ H01L 31/0232
[52] U.S. Cl. ........................ 257/432; 257/448; 257/459
[58] Field of Search .......................... 257/80, 81, 432, 257/433, 443, 82, 448, 457, 459, 461; 385/88–94

[56] References Cited

U.S. PATENT DOCUMENTS

| | | | |
|---|---|---|---|
| Re. 35,069 | 10/1995 | Hallenbeck et al. | 257/432 |
| 4,945,400 | 7/1990 | Blonder et al. | 257/432 |

FOREIGN PATENT DOCUMENTS

| | | |
|---|---|---|
| 54-1018 | 1/1979 | Japan . |
| 62-172744 | 7/1987 | Japan . |
| 1-321642 | 12/1989 | Japan . |
| 3-182707 | 8/1991 | Japan . |
| 4-64863 | 6/1992 | Japan . |
| 4-208905 | 7/1992 | Japan . |
| 5-259504 | 10/1993 | Japan . |
| 6-163869 | 6/1994 | Japan . |
| 9-90176 | 4/1997 | Japan . |

*Primary Examiner*—Minh Loan Tran
*Attorney, Agent, or Firm*—Whitham, Curtis & Whitham

[57] ABSTRACT

A light receiving element is comprised of a light sensitive surface on a semiconductor substrate and a positive electrode (anode), a negative electrode (cathode), a mounting precision test mask, a conductive electrode wire, and solder resist on the same substrate surface. A metal thin film, a mounting alignment mark, and a mounting precision mark window are provided on the back side of the substrate. Two or more electrode surfaces having either the anode or the cathode used as the common electrode are provided. The light sensitive surface is positioned approximately in the center between these two electrode surfaces. A highly precise mounting can therefore be achieved with the solder bump, even when mounting single light receiving elements. High precision mounting is also obtained when mounting light receiving element arrays. This type of light receiving element can be precisely positioned and bonded by solder bumps to a substrate having an optical fiber fitted in the V groove.

14 Claims, 9 Drawing Sheets

LIGHT RECEIVING DEVICE FOR USE IN OPTICAL FIBER COMMUNICATIONS AND THE LIKE

BACKGROUND OF THE INVENTION

1. Field of the Invention

This invention relates in general to light receiving devices utilized in optical communications and light measurement equipment, and relates in particular to light receiving devices containing light receiving elements and ideal for precision mounting on circuit substrates.

2. Description of Related Art

The light receiver device is indispensable for applications such as in optical fiber communications equipment.

In many cases in the related art, light receiver devices are discretely (individually) mounted as a device package. In recent years however, due to factors such as the integration of optical circuit components, light receiver elements are capable of being mounted on optical waveguide substrates. Further, array type light receiving devices are being developed having numerous light receiving elements formed in an array configuration on the circuit substrate to use the devices for parallel optical transmission.

In light receiving devices of the related art, an optical fiber may for instance be placed in a groove formed on the circuit substrate with a reflector formed at the end of the groove. The beam of light from the optical fiber in the groove is reflected upwards by this reflector. Silicon substrates are generally used since they permit a V groove to be made in the circuit substrate with high precision by etching.

The light receiving element is mounted above this reflector, with its light sensitive surface facing downwards. The light receiving element can thus receive the light sent from the reflector and allow the light to be converted to electrical signals and extracted externally. The light receiving element has an anode and a cathode. These electrodes each have a connecting section to a corresponding surface on the substrate. These electrodes (anode and cathode) are connected by solder to the pad formed on the substrate.

However in the structure of the light receiving device of the related art, about one half of the light receiving element is on the lower surface of the groove so that the electrode cannot be positioned directly below or in the vicinity the light receiving element. This makes it necessary to make connections with the substrate at locations where no V groove is formed.

Trying to slant the electrode versus the light receiving element to make connections, does not allow the electrode to be mounted securely. Even if the self-attachment method is used by means of a solder bump, the solder bump is only present at two locations and since the position is tilted, ample self-adjustment cannot be achieved so high precision mounting is difficult.

SUMMARY OF THE INVENTION

It is therefore an object of the light receiving device of this invention to provide precise position mounting by means of a solder bump for a structure that mounts the light receiving element above the groove provided on the substrate for installing optical fibers etc.

In order to solve the above mentioned problems, the light receiving device of this invention is provided with an optical fiber and a groove for placing the optical fiber at the end of the reflector for reflecting the light beam from the optical fiber perpendicularly onto the surface and, a substrate having a pad for attaching the electrode of the light receiving element. The light receiving element also includes a plurality of the above light receiving elements formed in rows of adjacent light receiving elements on both sides configured in a bar shape. The electrode from these adjoining light receiving elements is attached to a pad.

Either of the electrodes can be utilized as the electrode for the adjacent light receiving elements permitting attachment in at least three locations with the solder bump method and also yielding good self-alignment results. The attachment of the electrode and light receiving element is sufficiently strong.

A plurality of individual light receiving elements are placed between adjacent light receiving elements and the circuit substrate is provided with groove and optical fibers that correspond to each of the light sensitive surfaces of the light receiving elements. In other words, the light receiving device of this invention is characterized by a horizontal row of light receiving elements forming an array. Utilizing this configuration thus also permits forming a light receiving device in an array configuration.

The light receiving device of this invention is comprised of a light sensitive surface formed on the substrate 1 and, an anode and a cathode having external connections on the substrate 1 and, a plurality of light receiving elements having connecting sections to at least either the anode side or the cathode side.

More specifically, the light receiving element has at least one P-channel electrode and, at least two N-channel electrodes while the light sensitive surface is placed between the P-channel electrode and the N-channel electrode. The relation between the P-channels and N-channels can be reversed as needed.

The light receiving element utilized in the light receiving device of this invention has the anode and the cathode formed on the same surface. Either of these electrodes can be used as the common electrode and provided at two or more locations. When mounting flip-flop chips with the solder bump technique on substrates having optical fibers or circuit substrates having optical circuits consisting of light receiving elements, and there are three or more sections connecting to the external part of the electrode, these numerous electrode connecting sections will provide stable support to the light receiving elements. In array type light receiving devices having arrays of light receiving elements, the light receiving elements only need be provided in the necessary quantities to provide a compact and highly stable device. The adjacent light receiving elements used for connection as dummies in such cases can be limited to only half, allowing efficient use of the light receiving elements while also achieving greater compactness.

In the light receiving device of this invention, the light receiving element has a surface alignment mark on the same side as the light sensitive surface (substrate 1), for checking the position. The substrate 2 of the light receiving element is formed with a metallic layer except for the position corresponding to the surface alignment mark for the substrate 2 located on the rear of the substrate 1. Not relating to the above layer, the light receiving element is provided with a rear side alignment mark for checking the position of the substrate 2.

BRIEF DESCRIPTION OF THE DRAWINGS

These and other objects, advantages, features, and uses will become more apparent as the description proceeds when considered in conjunction with the accompanying drawings.

DETAILED DESCRIPTION OF THE PREFERRED EMBODIMENTS

Prior to describing the light receiving device of this invention, the light receiving device of the prior art will be described in order to ensure the invention is easily understood.

Figure 1:
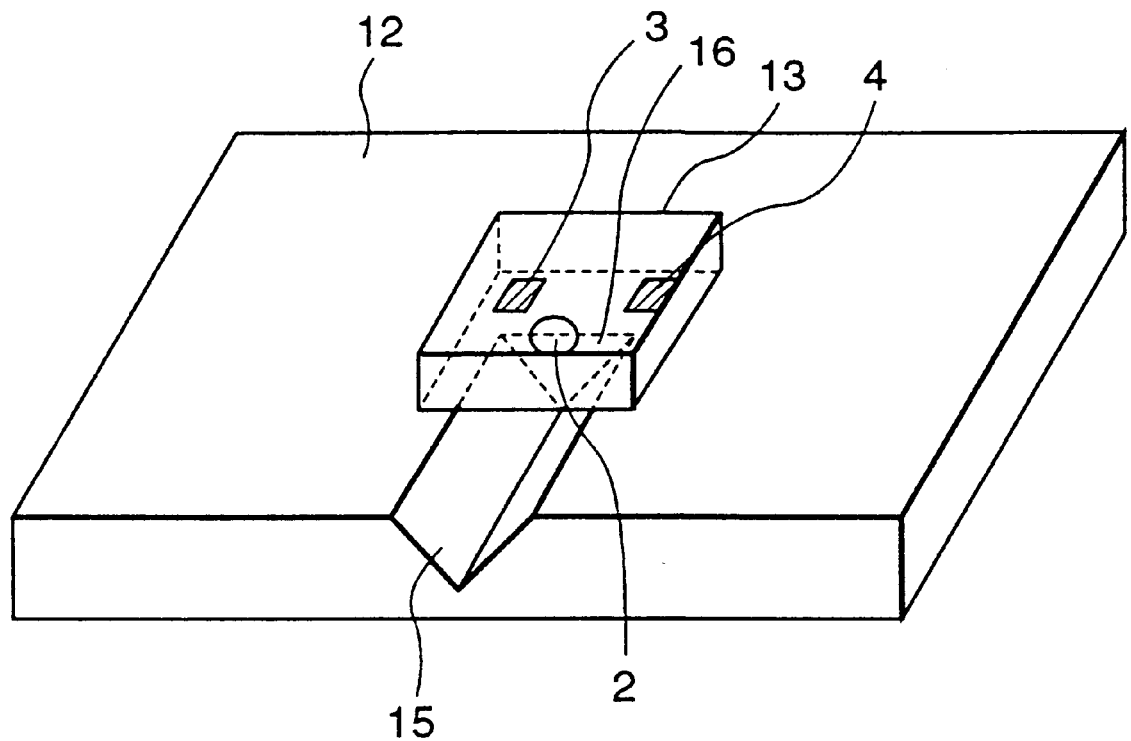
FIG. 1 is an oblique view of a structure of the light receiving device of the prior art.

FIG. 1 is an oblique view of an embodiment of the light receiving device of the prior art. As shown in the figure, an optical fiber (not shown) is placed in a groove 15 formed in a substrate 12. A reflector 16 is formed at the end of the groove. The light beamed from the optical fiber mounted in the groove 15 is reflected upwards by this reflector 16. Silicon substrates are generally employed as the substrate 12 since the V groove can be formed with high precision by etching.

A light receiving element 13 is mounted with a light sensitive surface 2 facing downwards, above the reflector 16. The light reflected from the light receiving element 13 by the reflector 16 is received, converted into a electrical signals and extracted externally. This light receiving element 13 has a cathode 3 and a anode 4 and a connecting section on the surface corresponding to the positions on the substrate 12. These electrodes 3 and 4, and the pad (not shown) formed on the substrate 12 are connected by soldering.

However in the structure of the light receiving device of the prior art about half of the lower surface of the light receiving element 13 is in the groove 15 so the electrode cannot be mounted directly beneath it or in the vicinity. Therefore, the connection with the substrate 12 must be made at a position where the groove 15 is not formed.

However as shown in FIG. 1, the electrodes 3 and 4 cannot be mounted securely when installed at positions tilted with respect to the light receiving element 13. Also, even if the self-alignment method by means of the solder bump is utilized, the solder bump will only be performed at two locations which is insufficient and the tilted position will prevent adequate self adjustment of position, making high precision mounting difficult to achieve.

Next, the light receiving device of this invention will be explained in detail while referring to the drawings.

Figure 2:
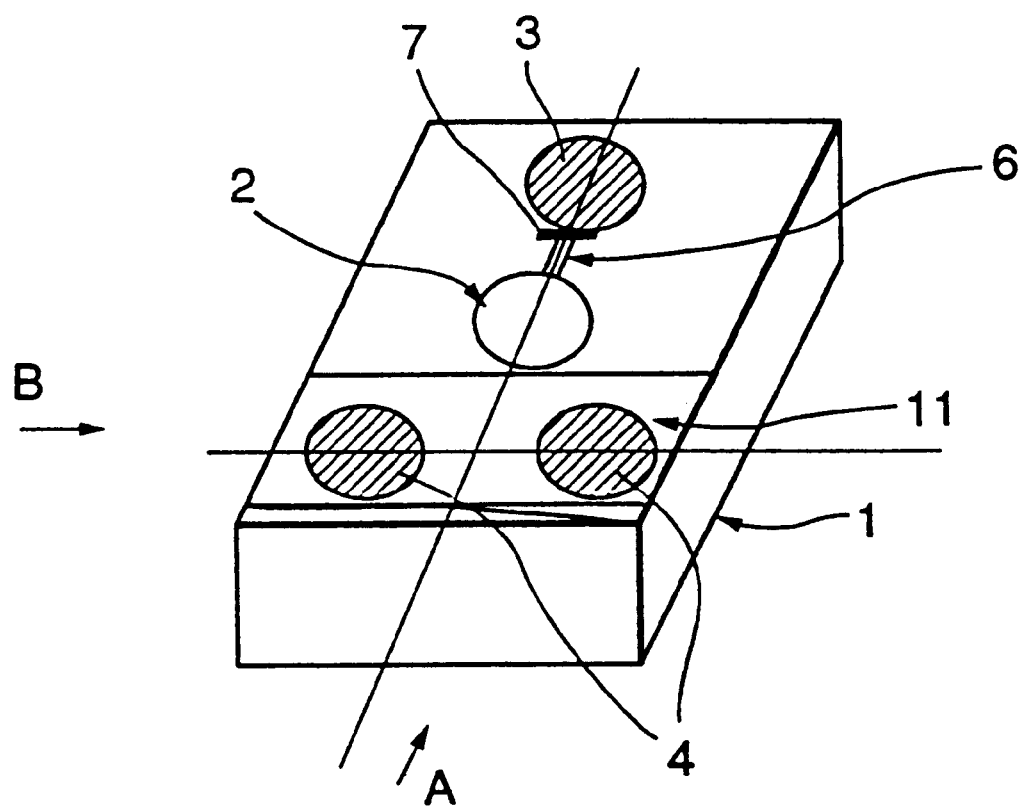
FIG. 2 is an oblique view of one embodiment of the light receiving element utilized in the light receiving device of this invention.
Figure 3A:
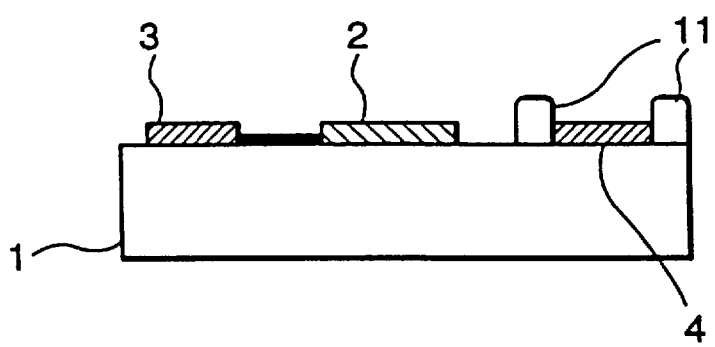
FIG. 3 is a cross sectional view of the light receiving element shown in FIG. 2.
Figure 3B:
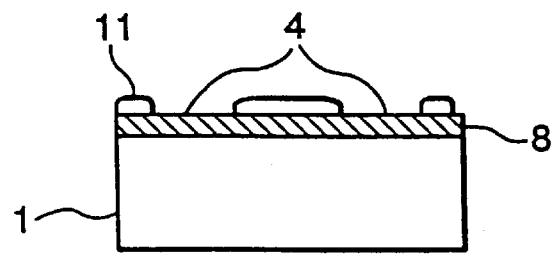

FIG. 2 is an oblique view of one embodiment of the light receiving element utilized in the light receiving device of this invention. FIG. 3 is a cross sectional view of the light receiving device of FIG. 2 as seen from the A direction and the B direction.

The device with the light receiving element shown in FIG. 2 and FIG.3 is generally formed with InP as light receiving element material on a substrate 1 which is formed with a light sensitive surface 2, a anode 3, a cathode 4, a mounting precision test mask 5, and a conductive electrode wire 6. The light receiving element of this embodiment has two cathodes 4 enclosing the light sensitive surface 2 and in a position opposite the anode 3. These two cathodes 4, as can be seen in (B) of FIG. 3, make electrical contact with a metal thin film 8 on the surface of the substrate 1. This will be explained in detail later, however this metal thin film 8 also connects all cathodes of the adjoining light receiving element joined as an uncut bar providing a common electrode. It is understood, however, that electrodes 3 and 4 may be swapped with 4 being the anode and 3 being the cathode without departing from the spirit of the invention.

The structure of said light receiving device mounted on the substrate installed with the optical fiber and light receiving element is described next.

Figure 4:
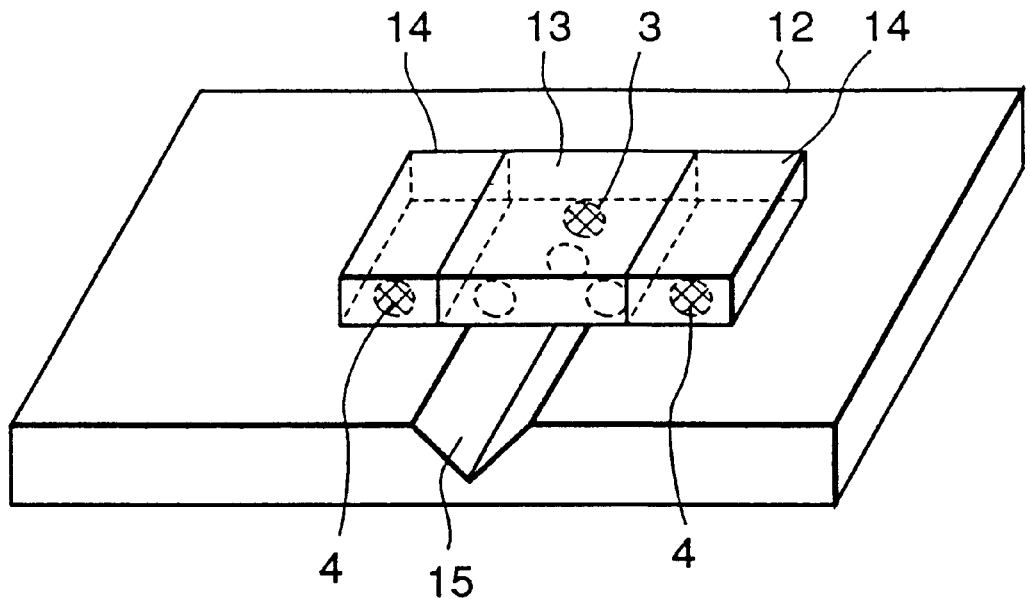
FIG. 4 is an oblique view showing the first embodiment of the light receiving device of this invention.

FIG. 4 is an oblique view showing the first embodiment of the light receiving device of this invention. An optical fiber, (not shown) is mounted on a V groove 15 formed on a silicon substrate 12 by etching. A reflector 16 (not shown) is provided at the end of the optical fiber. The light receiving element 13 so that the light sensitive surface 2 is above the reflector 16.

Here, the light receiving element 13 having the two cathodes shown in FIG. 2 reveals the unique aspect of this invention. One piece of the adjoining light receiving elements 14 adjacent to the light receiving element 13 is cut off from the bar along with the light receiving element 13. This adjacent light receiving element 14 is cut off so as to leave only one of the two cathodes remaining.

When the light sensitive surface 2 of light receiving element 13 on the silicon substrate is at the optimal position versus the reflector 16, the cathodes 4 of adjacent light receiving element 14 and the anode 3 of the light receiving element 13 are at corresponding positions on the pad. The electrodes at these three positions (shown with a crosshatch on the drawing of FIG.2) are attached by the solder bump method to the pad on the silicon substrate 1. The anode 3 and the light sensitive surface 2 are in close proximity so a solder resist 7 is provided to prevent flow of solder onto the light sensitive surface.

In the light receiving device of the related art, the electrodes must be mounted at a tilted position versus the light sensitive surface of the light receiving element due to the V groove. However, in this invention the electrodes are attached with a good balance in three locations so that a good effect from self alignment can be obtained. This means that the highly precise positioning can be achieved. Further, after attachment, this mounting is stable even under external environmental changes and changes over time.

Figure 5:
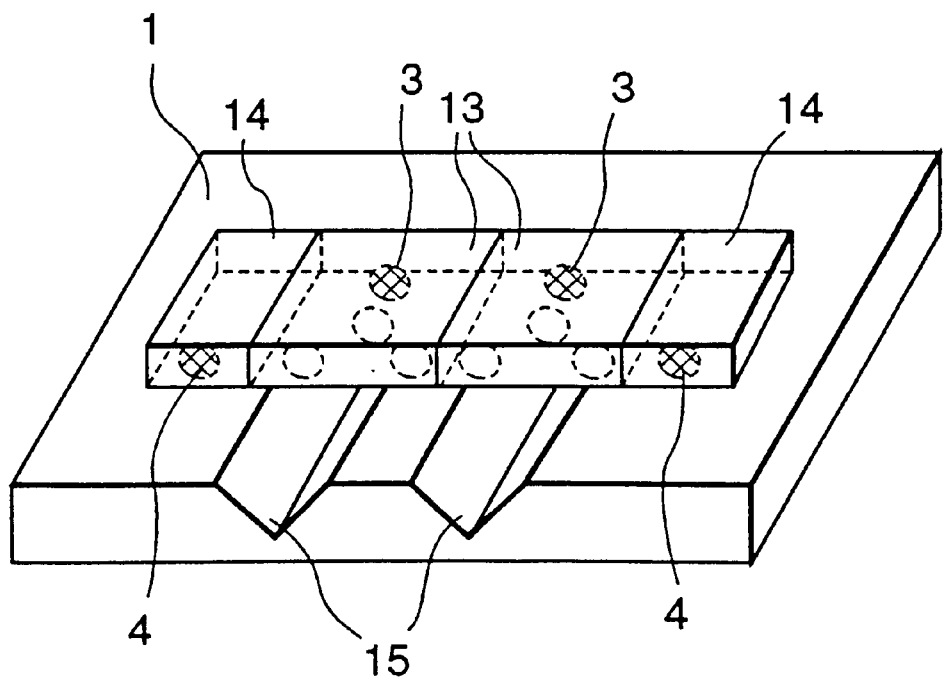
FIG. 5 is an oblique view showing the second embodiment of the light receiving device of this invention.

FIG. 5 is an oblique view showing the second embodiment of the light receiving device of this invention. FIG. 5 and FIG. 4 employ basically the same structure, however FIG. 5 shows a coupling of two optical fibers with two array type light receiving elements. The two light receiving elements 13 employed here are the same as the two elements in FIG. 4. However, when cut off from the bar, the two adjoining light receiving elements 14 are cut off along with the two light receiving elements 13.

Even here, the anode 3 (far side on the drawing) at a position with no V groove, is connected unchanged, and the electrode of light receiving element 13 is connected to the substrate 12. However, the cathode which is positioned at a location with a V groove, is not connected to light receiving element 13 but instead the cathode 4 is connected to the substrate 12. This configuration is made possible by the fact as mentioned above, that the cathodes are all connected by the thin metal film 8 between the light receiving element so that electrical conductivity is obtained.

Figure 6A:
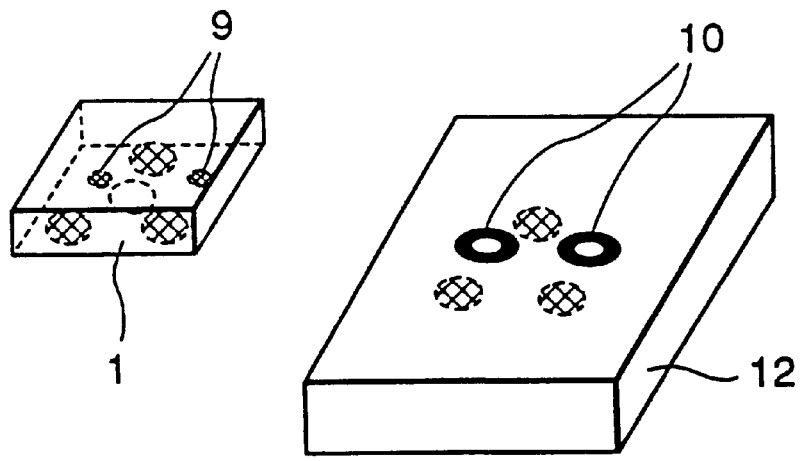
FIG. 6 is a drawing showing the process for mounting the light receiving device of this invention onto the substrate by means of the alignment mark on the light receiving element.
Figure 6B:
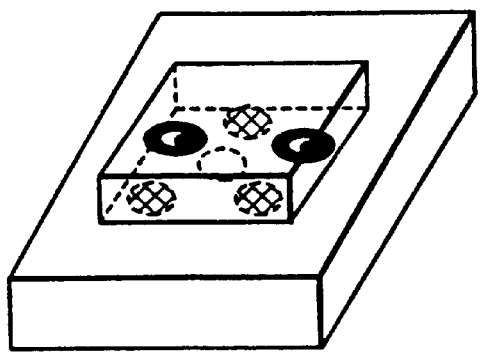
Figure 6C:
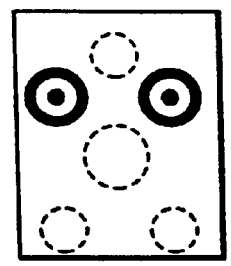

By employing this structure which is one feature of this invention, stable positioning having high precision can be achieved even when comprising an array type light receiving device. Here we will describe the evaluation of mounting precision of the light receiving element 13 after mounting was performed. FIG. 6 illustrates the mounting process used for the light receiving element 13. FIG. 6 (*a*) is a drawing for respectively evaluating positioning precision prior to mounting in (*b*) and after mounting (*c*). The mounting process is fundamentally the same as explained previously however as shown in the figure, a mounting precision test mask 10 is provided on the surface of the substrate 12. A mounting alignment mark 9 is also provided on the light receiving element 13.

As shown in FIG. 6 (*c*), the alignment marks 9 and 10 have been positioned beforehand to align with each other when the light beam reflected from the reflector 16 on the substrate 12 matches the light sensitive surface 12 of the light receiving element 13 as explained for FIG. 2. Therefore, when the light receiving device is viewed from above after mounting, the actual mounting precision can be evaluated by measuring the relative positions of both alignment marks.

Figure 7:
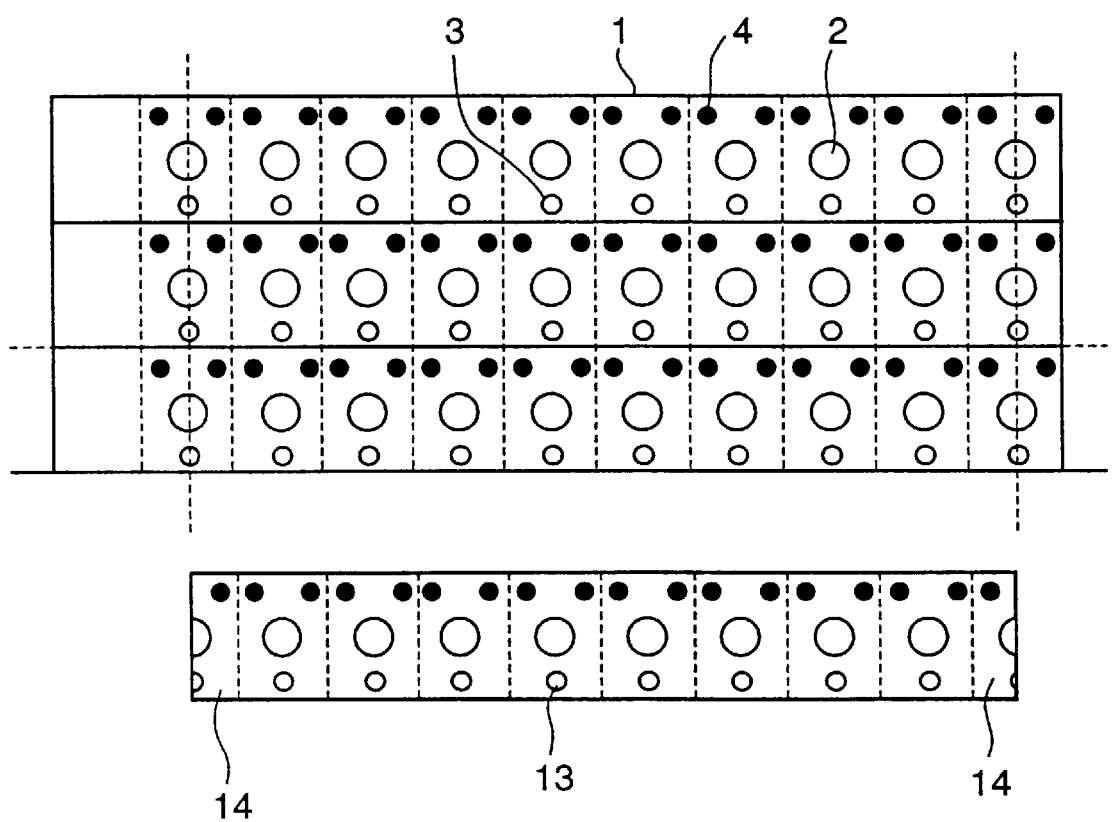
FIG. 7 is a view showing a bar arrangement of light receiving element arrays utilizing the array type light receiving device of this invention.
Figure 8:
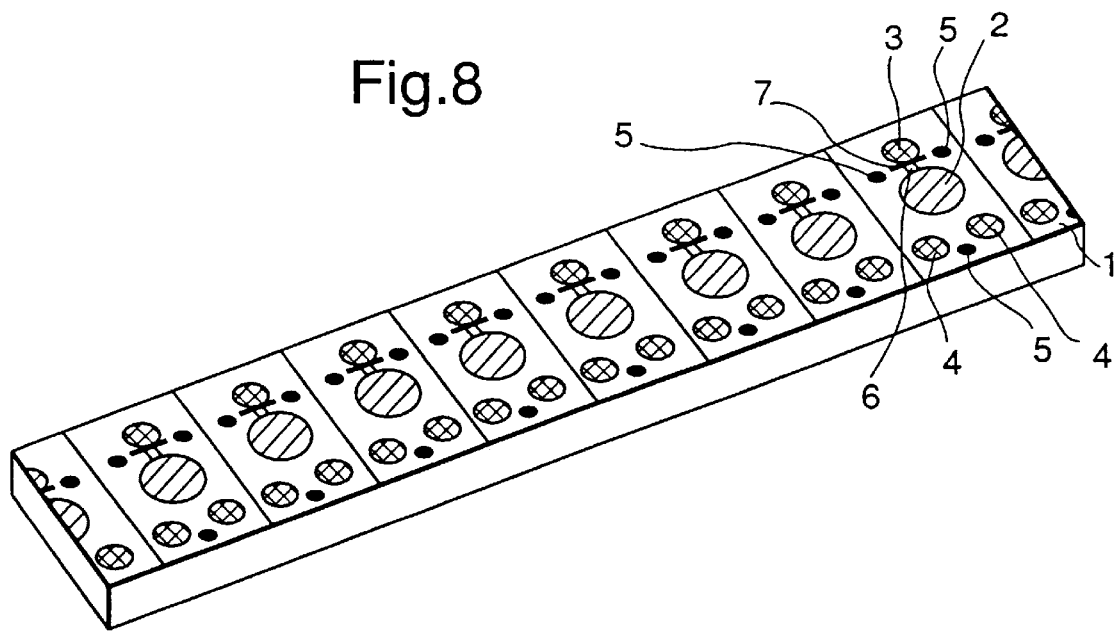
FIG. 8 is an oblique view showing the array type light receiving element of FIG. 7.
Figure 9:
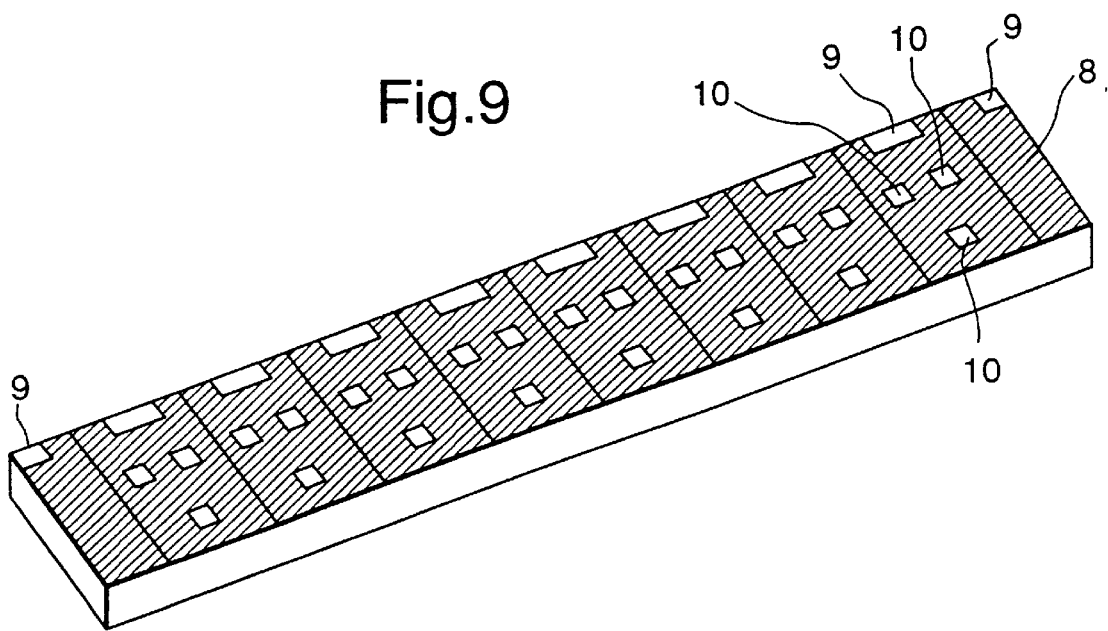
FIG. 9 is an oblique view showing the array type light receiving element of FIG. 8 from the rear side.

The light receiving device of this invention can be used not only with the 2-channel array type light receiving devices as shown in FIG. 5, but also with array type light receiving devices having a plurality of channels. FIG. 7 shows a light receiving element array in a bar configuration planned for use in an 8-channel array type light receiving device. In this case also, the bar is cut to include a piece allowing use of the cathode with the light receiving element 14 on both adjoining sides. FIGS. 8 and 9 are oblique views of said light receiving element array. FIG. 8 is a view from the light sensitive surface 2 and FIG. 9 is a view as seen from the opposite side (upper side after mounting).

The third embodiment of the light receiving device of this invention will be explained next. Here, return to FIG. 4 and consider the structure of the single channel light receiving device. To achieve the light receiving device of this invention, the structure in FIG. 4 has a limited cutoff of the adjacent light receiving elements 14. In other words, by providing two electrodes positioned above the V groove, the cutoff of the adjacent light receiving elements 14 can be reduced to half and the remaining light receiving elements adjacent to light receiving elements 14 can themselves be used as the main light receiving elements.

Figure 10:
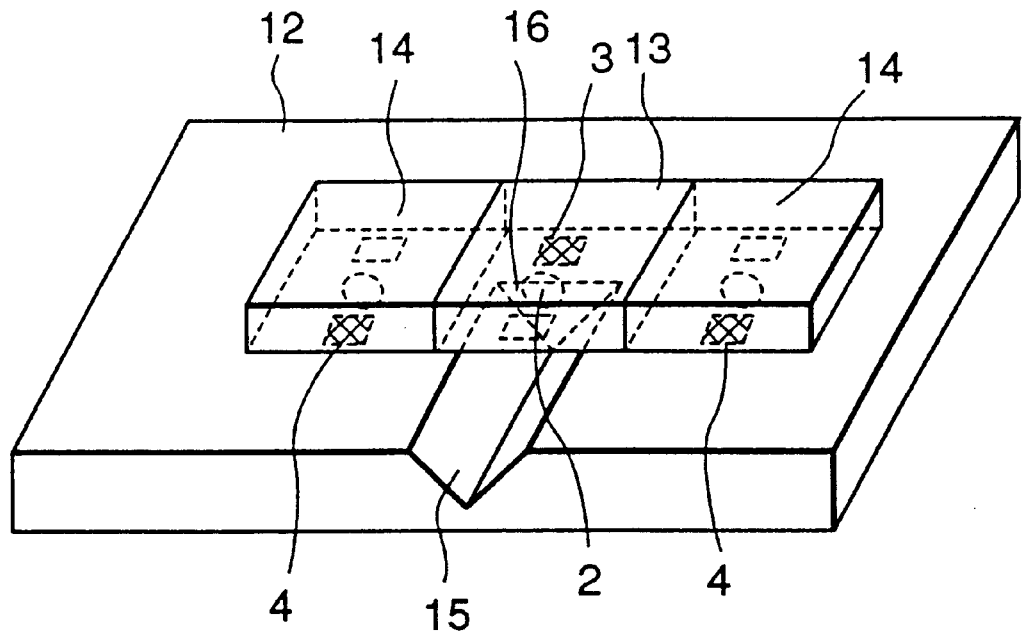
FIG. 10 is an oblique view showing the third embodiment of the light receiving device of this invention.

However if this approach is not used, the structure shown in FIG. 10 is applicable. In the structure shown in FIG. 10, the light receiving element 13 and adjacent light receiving elements 14 each have only one cathode 4. In this case too, if just one (total of 2 on both sides) adjacent light receiving element 14 is cut off, then stable mounting of a flip-flop chip can be obtained.

Figure 11:
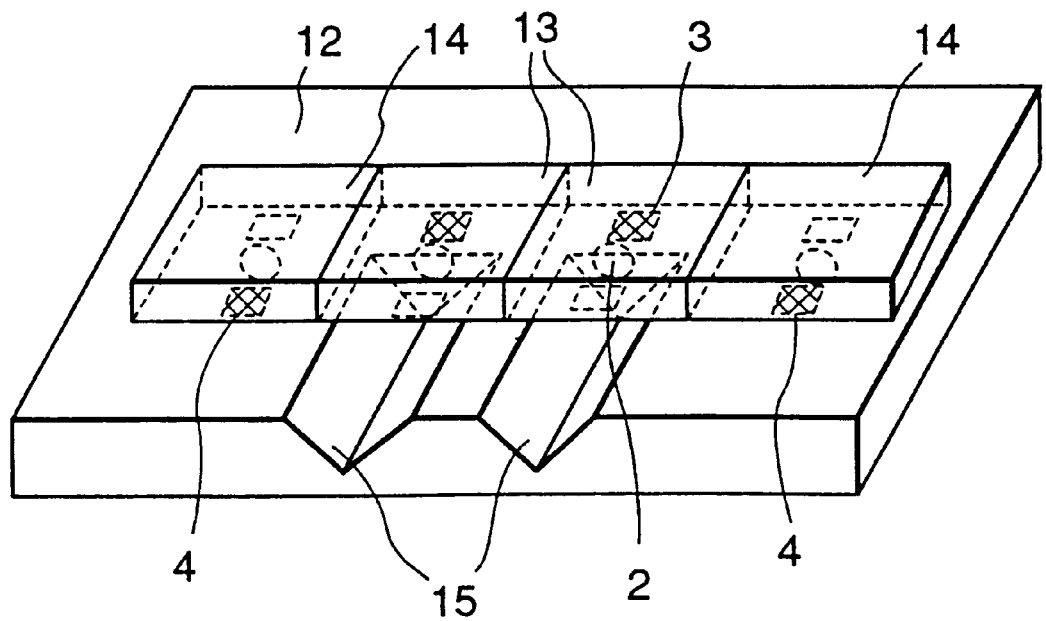
FIG. 11 is an oblique view showing the fourth embodiment of the light receiving device of this invention.
Figure 12:
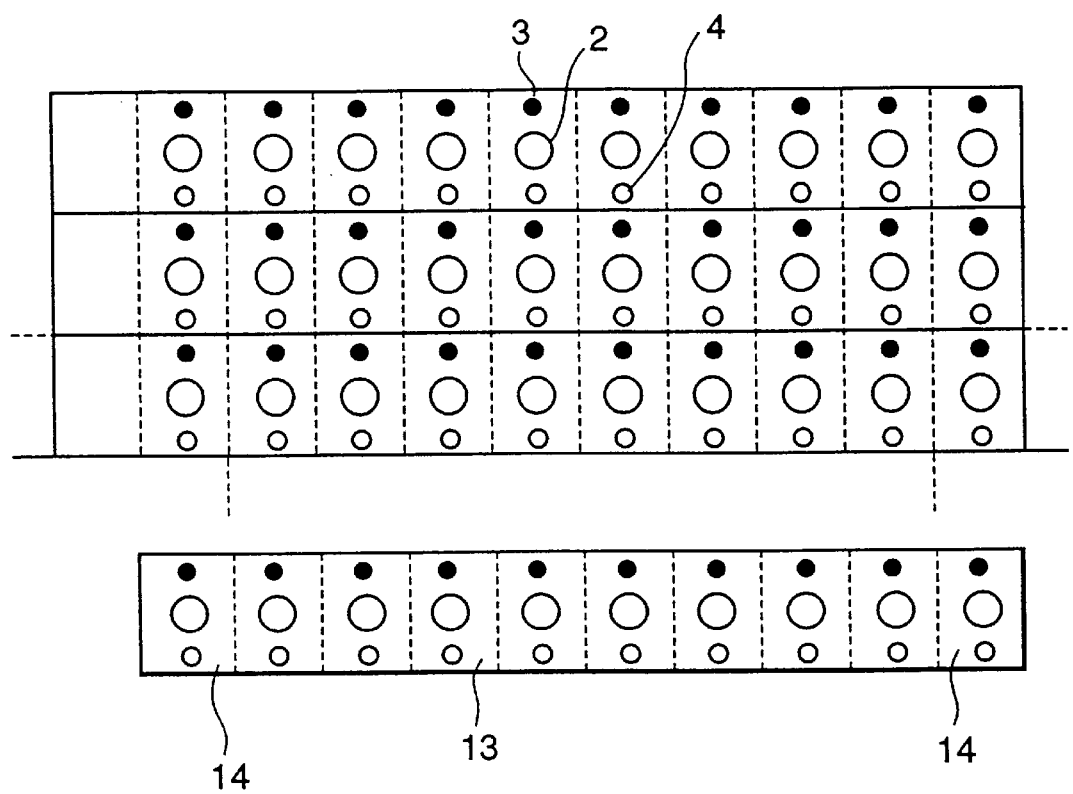
FIG. 12 is a view showing a bar arrangement of light receiving element arrays utilizing the array type light receiving device of this invention.

FIG. 11 shows the fourth embodiment of the invention which corresponds to the structure in FIG. 5. This structure is applicable to array type light receiving devices as can be seen in the figure. FIG. 12 shows a light receiving element structure used in an array type light receiving device having a plurality of channels.

The light receiving device of this invention as explained above has a plurality of electrode external connecting sections so that high precision mounting on a substrate can be obtained such as when mounting flip-flops by utilizing the solder bump method on light receiving elements. Further, the light receiving elements utilize alignment marks that not only permit efficient mounting on the substrate but also allow measurement of mounting position accuracy after being mounted.

Also, in light receiving devices having an array structure, the wiring is easily performed since power can be supplied by installing at least one wire from the power supply to feed voltage lo the substrate.

While this invention has been described in connection with certain embodiments, it should be understood that the scope of the subject matter encompassed by this invention is not limited to those specific embodiments. On the contrary, the subject matter of this invention is intended to include all alternatives, modifications and equivalents as can be included within the spirit and scope of the following claims.

What is claimed is:

1. A light receiving device comprising a light receiving element having a light sensitive surface formed on a first substrate and including an anode and cathode formed on the same surface of said first substrate for external connection, said anode has a plurality of connecting points, wherein said light receiving element contains a single p-channel electrode and two n-channel electrodes and said light sensitive surface is formed between said p-channel electrode and said n-channel electrodes.

2. A light receiving device as claimed in claim 1, wherein a plurality of said light receiving elements comprise a linear array of light receiving elements.

3. A light receiving device as claimed in claim 2, wherein said light receiving element is provided with an optical fiber and, a groove having a reflector at the edge for reflecting a beam of light from said optical fiber perpendicularly onto said light sensitive surface, is provided for mounting said optical fiber and, a substrate having a pad for mounting said electrodes of said light receiving element, and said light receiving element including adjacent light receiving elements on both sides, is cut off from a row of said light receiving elements configured in a bar shape, and the electrodes of said light receiving elements and said adjacent light receiving elements are attached to said pad.

4. A light receiving device as claimed in claim 3, wherein a plurality of said electrodes of said light receiving element are placed between said adjacent light receiving elements, and said substrate is provided with said groove and said optical fiber corresponding to the light sensitive surfaces of said light receiving elements.

5. A light receiving device as claimed in claim 2, wherein said light receiving element is provided with a surface alignment mark for checking the position on said first substrate.

6. A light receiving device comprising a light receiving element having a light sensitive surface formed on a first substrate and including an anode and cathode formed on the same surface of said first substrate for external connection, with said cathode having a plurality of connecting points, wherein said light receiving element contains two p-channel electrodes and a single n-channel electrode and said light sensitive surface is formed between said p-channel electrodes and said n-channel electrode.

7. A light receiving device as claimed in claim 6, wherein a plurality of said light receiving elements comprise a linear array of light receiving elements.

8. A light receiving device as claimed in claim 7, wherein said light receiving element is provided with an optical fiber and, a groove having a reflector at the edge for reflecting a beam of light from said optical fiber perpendicularly onto said light sensitive surface, is provided for mounting said optical fiber and, a substrate having a pad for mounting said electrodes of said light receiving element, and said light receiving element including adjacent light receiving elements on both sides, is cut off from a row of light receiving elements configured in a bar shape, and the electrodes of said light receiving element and said adjacent light receiving elements are attached to said pad.

9. A light receiving device as claimed in claim 8, wherein a plurality of said electrodes of said light receiving element are placed between said adjacent light receiving elements, and said substrate is provided with said groove and said optical fiber corresponding to the light sensitive surfaces of said light receiving elements.

10. A light receiving device as claimed in claim 7, wherein said light receiving element is provided with a surface alignment mark for checking the position on said first substrate.

11. A light receiving device, wherein a light receiving element has an anode electrode, and a cathode electrode, an optical fiber, a groove having a reflector at an edge for reflecting a beam of light from said optical fiber perpendicularly onto a surface which is provided for mounting said optical fiber, a substrate having a pad for mounting said electrodes of said light receiving element, said light receiving element including adjacent light receiving elements on both sides and is cut off from a row of said light receiving elements configured in a bar shape, said light receiving device is characterized in that the electrode of said adjacent light receiving elements is attached to said pad.

12. A light receiving device as claimed in claim 11, wherein a plurality of said electrodes of said light receiving element are placed between said adjacent light receiving elements, said substrate is provided with said groove and said optical fiber corresponding to light sensitive surfaces of said light receiving elements.

13. A light receiving device comprising a light receiving element having a light sensitive surface formed on a first substrate and including anode and cathode electrodes formed on the same surface of said first substrate for external connection, said anode has a plurality of connecting points and, said light receiving element containing solder resist placed between one of the electrodes and said light sensitive surface.

14. A light receiving device comprising a light receiving element having a light sensitive surface formed on a first substrate and including anode and cathode electrodes formed on the same surface of said first substrate, for external connection, said cathode has a plurality of connecting points and said light receiving element containing solder resist placed between one of the electrodes and said light sensitive surface.

* * * * *